United States Patent [19]

Sato et al.

[11] 4,261,761
[45] Apr. 14, 1981

[54] METHOD OF MANUFACTURING SUB-MICRON CHANNEL WIDTH MOS TRANSISTOR

[75] Inventors: Shuichi Sato, Beaverton; Tadanori Yamaguchi, Portland, both of Oreg.; Arthur D. Ritchie, San Diego, Calif.

[73] Assignee: Tektronix, Inc., Beaverton, Oreg.

[21] Appl. No.: 71,965

[22] Filed: Sep. 4, 1979

Related U.S. Application Data

[62] Division of Ser. No. 862,715, Dec. 21, 1977, Pat. No. 4,217,599.

[51] Int. Cl.³ .................................... H01L 21/265
[52] U.S. Cl. .................................. 148/1.5; 148/187; 357/23; 357/91
[58] Field of Search .................. 148/1.5, 187; 357/23, 357/91

[56] References Cited

U.S. PATENT DOCUMENTS

| | | | |
|---|---|---|---|
| 3,961,999 | 6/1976 | Antipov | 148/175 |
| 4,013,484 | 3/1977 | Boleky et al. | 148/1.5 |
| 4,029,522 | 6/1977 | De La Moneda | 148/1.5 |
| 4,033,026 | 7/1977 | Pashley | 29/571 |
| 4,044,454 | 8/1977 | Magdo | 29/578 |
| 4,052,229 | 10/1977 | Pashley | 148/1.5 |
| 4,078,947 | 3/1978 | Johnson et al. | 148/1.5 |
| 4,101,344 | 7/1978 | Kooi et al. | 148/1.5 |
| 4,171,229 | 10/1979 | Simi et al. | 148/1.5 |
| 4,175,983 | 11/1979 | Schwabe | 148/1.5 |

OTHER PUBLICATIONS

Oldham, W. G., Scientific American, 237, (Sep. 1977), p. 111.
Knepper, R. W., IBM-TDB, 15, (1973), 2919.
Makris et al., IBM-TDB, 16, (1974), 3240.

Primary Examiner—L. Dewayne Rutledge
Assistant Examiner—Upendra Roy
Attorney, Agent, or Firm—John D. Winkelman

[57] ABSTRACT

Improved, high performance MOS transistors are provided by a method that includes providing an oxygen-impermeable mask on a selected region of a semiconductor substrate, oxidizing the unmasked portion of the surface to provide a thick oxide at least partially recessed in the substrate, which layer includes a smoothly tapered beak that extends between the margin of the mask and the underlying silicon surface, and, after removing the mask, implanting a selected impurity in the substrate beneath the selected region to form a thin impurity layer that terminates at a sloped portion of the substrate formed by the oxidation step.

7 Claims, 16 Drawing Figures

METHOD OF MANUFACTURING SUB-MICRON CHANNEL WIDTH MOS TRANSISTOR

This is a division of application Ser. No. 862,715, filed Dec. 21, 1977, now U.S. Pat. No. 4,217,599.

BACKGROUND OF THE INVENTION

The present invention relates generally to metal-oxide-semiconductor (MOS) devices, and more particularly to methods for manufacturing high performance MOS field effect devices adapted for large scale integration on semiconductor substrates. The invention further relates to non-planar MOS devices characterized by submicron channel widths.

Metal-oxide-semiconductor field effect devices conventionally include source and drain regions formed on the upper surface of a silicon wafer, interconnected by a channel region. A gate electrode is disposed overlying the channel region, insulated from it by a thin film of oxide or other suitable dielectric. Current flow between the source and drain regions is controlled by applying a voltage to the gate electrode.

The performance (i.e., the frequency response or switching speed) of such a device depends on the dimensions of its components, particularly the length of its channel. Normally, the channel length of an MOS device is determined by the photolithographic and impurity diffusion processes used to form its source and drain regions. As conventionally practiced, these processes do not permit the formation of as short a channel as desired for maximum performance.

Several high performance MOS technologies have been developed in recent years. These include a scaled-down silicon gate MOS process called H-MOS by its principal proponent; V-MOS (for "vertical MOS"), a double-diffusion process featuring anisotropic etching of a V-shaped groove in the silicon wafer; and a planar double-diffusion process called D-MOS. While these technologies all are capable of producing devices having switching speeds approaching those of bipolar devices, none is without its disadvantages. For example, H-MOS, which relies on scaling down the size and parameters of conventional planar MOS devices, places great demands on a manufacturer's ability to form very fine patterns accurately and reproducibly. The production of V-MOS devices requires the use of two relatively high cost processes: epitaxial deposition and anisotropic etching. D-MOS, in which channels are defined by successive diffusions of n- and p-type impurities through the same mask opening, requires a precise diffusion source and superior process control to achieve narrow channel widths reproducibly. In addition, both H-MOS and D-MOS share the disadvantage (in applications requiring high packing density) of being planar processes, which require more wafer surface area than nonplanar processes such as V-MOS.

SUMMARY OF THE INVENTION

The present invention is based, inter alia, on the recognition that in the selective doping of semiconductor substrates by ion implantation, ion penetration depth at a given accelerating potential can be varied by varying the thickness of an oxide layer formed on the substrate surface. Thus, by providing an oxide layer of continuously increasing thickness, a thin impurity layer of similarly decreasing depth can be implanted. Further, by recessing such an oxide layer in the substrate surface, a buried impurity layer having an upturned edge terminating at a sloped portion of the semiconductor surface may be provided. This technique is utilized to make an MOS device in which the length of the channel is determined by the thickness of an implanted impurity layer. As is known, exceedingly thin layers can be formed by ion implantation, allowing devices to be made that have much narrower channels than those of conventional MOS devices.

In the method of the invention, a mask comprising a oxygen impermeable layer is formed on a selected first region of a semiconductor substrate surface. The surface is then selectively oxidized to provide a recessed oxide layer on the unmasked portion, which layer includes a continuous, symmetrically tapered edge, or beak, extending between the margin of the oxygen-impermeable layer and the underlying portion of the masked substrate surface. After removing the oxygen-impermeable layer, a thin zone of a first impurity is implanted in the substrate beneath the selected first surface region. As already described, the implanted zone includes an an upturned edge that terminates at a sloped portion of the substrate surface formed by the oxidation step.

After implantation of the first impurity zone, the upturned edge of which forms the device's channel, a second impurity of an opposite conductivity type is introduced into the semiconductor substrate at the first surface region. A surface zone of the opposite type impurity is thereby formed adjacent the channel-forming zone to serve as the device's source region. The insulating oxide layer is removed, and a gate insulating film formed over a portion of the substrate surface that includes the channel. Another surface zone of the opposite type impurity is formed in the substrate to serve as a drain region. Preferably, the drain region is spaced from the channel to provide a drift region between the two. Finally, suitable electrodes are formed on the gate insulating film and in contact with the source and drain regions. In a preferred construction, the gate electrode overlaps the source region slightly but does not overhang the drain region, minimizing gate-to-drain capacitance. The drift region provided between the channel and drain region permits much higher operating voltages to be used than is possible with conventional planar MOS devices. In addition, by disposing a portion of the device on the slope produced during oxidation of the masked substrate surface, the amount of substrate area required is reduced, an important factor in the large scale integration of microelectronic circuits.

DESCRIPTION OF PREFERRED EMBODIMENTS

Referring now to FIGS. 1a–1f, which illustrate successive steps in the manufacture of enhancement mode n-MOS transistors, an oxide layer 12 and an oxygen impermeable layer 14, suitably of silicon nitride (Si3N4), are formed on the upper surface of a p- doped, 10 ohm-cm. monocrystalline silicon wafer 10. Layers 12 and 14 are fabricated by conventional, well known methods. Oxide layer 12 may be about 300 to about 600 angstrons thick, typically about 400 angstroms. The nitride layer may be in the range of about 0.1 to about 0.2 microns, typically about 0.13 microns.

Figure 1A:
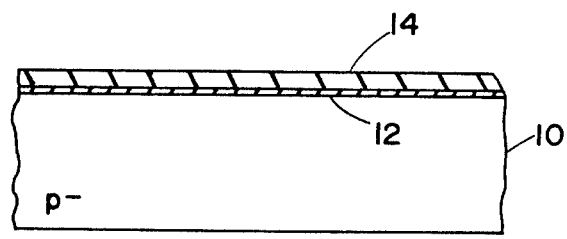
FIGS. 1a–1g illustrate in cross-sectional form a metal-oxide-semiconductor device at successive steps of manufacture in accordance with a first embodiment of the invention.
Figure 1B:
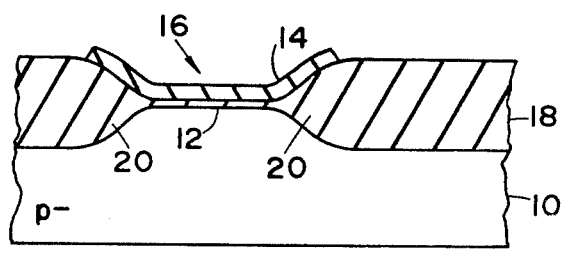
Figure 1C:
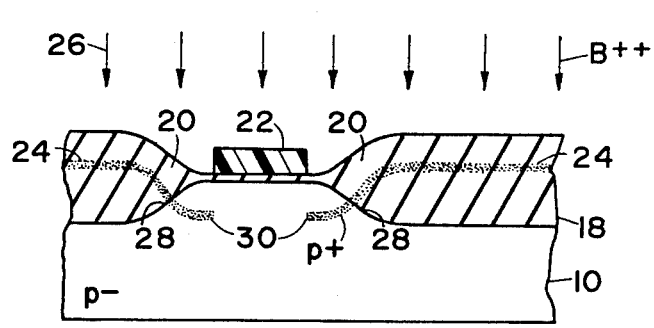
Figure 1D:
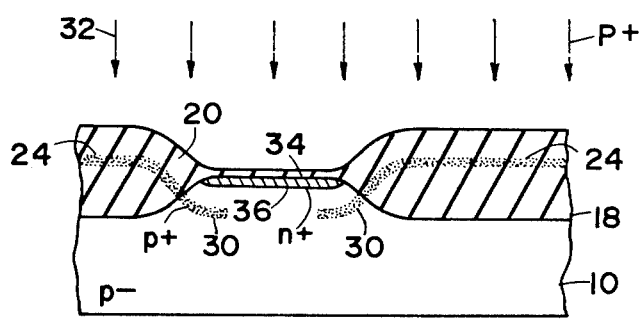

Next, a mask 16 is formed on a first surface region of wafer 10 by selectively etching away corresponding portions of nitride layer 14 and oxide layer 12. The unmasked areas of the wafer are then locally oxidized to form a thick oxide layer 18 recessed in the upper surface of wafer 10, as shown in FIG. 1b. As is known, local oxidation of a silicon surface masked by a nitride-oxide duplex layer produces oxide "beaks" 20 that extend between the margin of the oxygen impermeable nitride layer and the underlying portion of the wafer's upper surface. The formation of such beaks is described in an article by J. S. Appels et al., entitled "Local Oxidation of Silicon; New Technological Aspects" and published in Philips Research Reports, Vol. 26, No. 3, Pages 157–165. Although oxide beak formation previously has been considered to be a disadvantage (see, for example, U.S. Pat. No. 4,008,107 to Hayasaka et al.), the present invention is based on using such beaks to vary the depth of a subsequently implanted impurity layer. Layer 18 suitably has a maximum thickness in the range of about 1.5 to 3.0 microns, typically about 2.0 microns, with beaks 20 providing a smoothly tapered transition to the thickness of oxide layer 12 beneath mask 16.

Following the local oxidation step, nitride layer 16 is removed and a mask 22 of a photoresist material is provided overlying the central portion of the first surface region. A very thin layer 24 of a p-type impurity, suitably boron, is implanted in wafer 10 and oxide layer 18 by ion bombardment, as indicated by arrows 26 in FIG. 1c. As is known, the ion penetration resistance of silicon and SiO2 is about the same. The contour of the implanted layer thus substantially matches the upper surface contour of the wafer's oxide coating, except in the region underlying photoresist mask 22. By controlling the penetration of the boron ions in a known manner, layer 24 is implanted at a depth such that it crosses the slopes 28 on the wafer surface created by the local oxidation step. For an oxide layer 18 having a maximum thickness of about 2 microns, boron ions accelerated to bout 130,000 electron volts will penetrate to a depth of about 0.5 microns, forming an impurity layer 24 about 0.13 micron thick that crosses slopes 28 at about their midpoint. Boron concentrations of about 2 to $8 \times 10^{12}$ atoms/cm$^2$ are suitable.

The portions of layer 24 within the silicon wafer form p+ zones 30 that terminate along slopes 28 beneath beaks 20. These zones, which form channel regions in the transistors, typically are on the order of about 0.1 to 0.15 microns thick following the implantation step. As is known, ion implantation damages the silicon crystal lattice, and to heal this damage wafer 10 is annealed after implantation of layer 24. If performed at moderate temperatures (i.e. about 1,000° C.) little diffusion of zone 30 takes place. At higher temperatures, diffusion produces an increase in the thickness of the channel-forming zones. Thus, channel width can be varied, if desired, by controlling the annealing time and temperature.

Mask 22 is now removed and an n-type impurity, suitably phosphorus, is introduced into the previously mentioned first surface region of wafer 10. Although the n-type impurity could be diffused into the wafer in a conventional manner after etching a window in the oxide coating, preferably the impurity element is implanted by ion bombardment, as indicated by arrows 32 in FIG. 1d. By adjustment of the acceleration potential, the phosphorus ions can be made to penetrate the thin oxide layer 12 overlying plateau region 34 of the wafer, but not the thicker local oxide layer 18. The implantation, which may be an energy of about 100–200 kev and a concentration of about 1 to $5 \times 10^{15}$ atoms/cm$^2$, creates a shallow n+ zone 36 adjoining the surface in plateau region 34. Subsequently annealing of the wafer for 20 minutes is about 900° C. diffuses zone 36, which forms a source region for the transistors, to a nominal depth of about 0.4 microns.

Figure 1E:
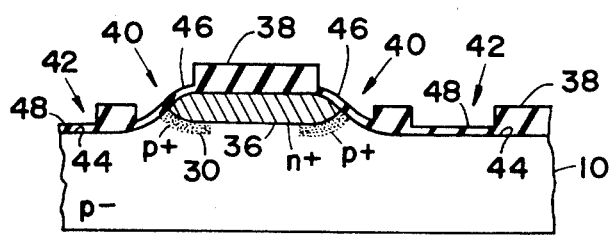
Figure 1F:
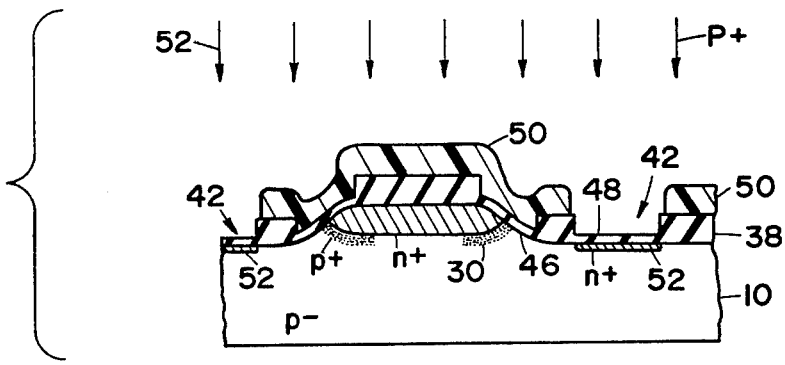

The variable thickness oxide coating formed by layers 12 and 18 is next removed completely, after which silicon dioxide is deposited by conventional means on the exposed upper surface of wafer 10 to form an oxide layer 38 having a thickness of approximately 1 micron. Portions of layer 38 are removed by photoetching at selected locations 40 where gate structures are to be fabricated overlying slopes 28. Portions of the oxide layer are similarly removed at selected locations 42 on the recessed planar portions 44 of the wafer surface where drain regions are to be provided subsequently. The thus exposed portions of the wafer surface are oxidized to form a thin gate oxide film 46 at locations 40 and an oxide film 48 at locations 42. Films 46 and 48 suitably have a thickness of about 1000 angstroms. The resulting structure is shown in FIG. 1e.

Next, a photoresist masking layer 50 having windows at locations 42 is formed on the wafer. An n+ drain region 52 is provided in wafer 10 beneath film 48 by implanting an n-type impurity through the oxide film, as indicated by arrows 52 in FIG. 1f. By way of example, phosphorus may be implanted at an energy of about 200 kev and a concentration of about $5 \times 10^{15}$ atoms/cm$^2$. Alternatively, drain region 52 can be provided by diffusion in a conventional manner after removal of oxide film 48 to expose the wafer surface.

Photoresist layer 50 is stripped and the wafer annealed for about 20 minutes at about 1000° C. to heal the damage caused by ion implantation and diffuse the drain region to a greater depth. After annealing, openings are etched in oxide layer 38 and oxide film 48 to expose portions of source region 36 and drain regions 52, respectively. A layer of metal, suitably aluminum, is vacuum deposited on the upper surface of the wafer and selectively photoetched to define a source electrode 54, gate electrodes 56 and drain electrodes 58. Finally, a passivation coating 60, suitably of silicon nitride, is provided for contamination protection.

Figure 1G:
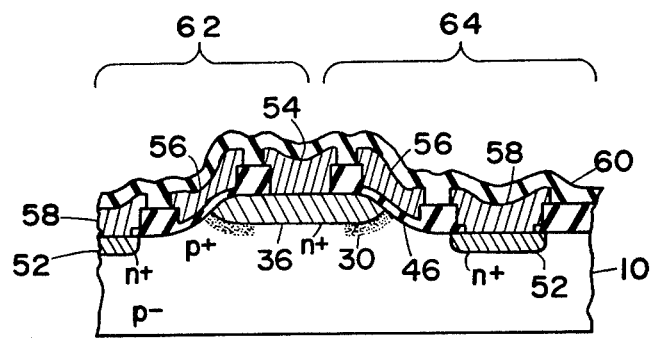

The resulting structure, shown in FIG. 1g, includes a pair of transistors 62 and 64 sharing a common n+ source region 36 formed in a plateau on the upper surface of wafer 10. A thin, implanted p+ channel-forming zone 30 in each transistor adjacent the source region includes an edge that abuts the slope joining the plateau to a recessed portion 44 of the wafer surface. An important feature of the invention is that the thickness of that edge determines the length of the channels in transistors 62, 64. Ion implantation techniques permit the formation of very thin channel-forming zones, and since the frequency response of a MOS transistor is inversely related to channel length, very high performance MOS transistors can be provided. Disposed on the surface slopes, overlying the edge of each zone 30, is a gate structure comprising insulating oxide film 46 and electrode 56.

Transistors 62, 64 additionally include n+ drain regions 52 formed on the recessed upper surface of wafer 10. As will be noted, the drain regions are spaced from the channel zones to provide a pi or drift region between them. This drift region permits the use of increased operating voltages and minimizes source-to-drain capacitance. In addition, it will be seen that the spacing provided by the drift region allows the gate electrode to be made long enough for high amplification without overlapping the drain region. The structure thus minimizes deleterious gate-to-drain capacitance.

Figure 2A:
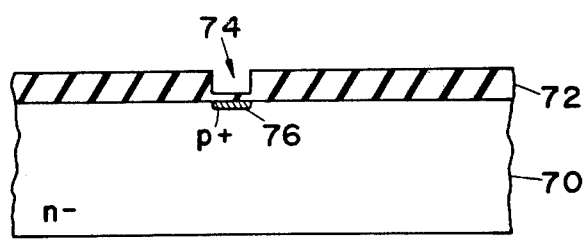
FIGS. 2a–2f illustrate successive steps in making an MOS device according to a second embodiment of the present invention.
Figure 2B:
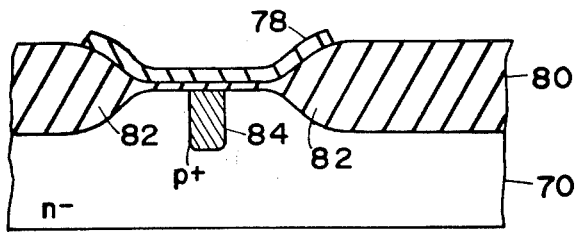

FIGS. 2a-2f illustrate the manufacture of n-MOS transistor structures according to a second embodiment of the invention. On the upper surface of a n-doped silicon wafer 70 is formed a layer 72 of $SiO_2$ about 1 micron thick. A diffusion window 74 is etched in layer 70 and a p-type impurity, suitably boron, is selectively diffused through the window to form a high concentration p+ region 76 in the wafer. As shown in FIG. 2a, an oxide skin forms on the exposed wafer surface during the diffusion. The oxide layer and skin are entirely removed from wafer 70, and a duplex silicon oxide-nitride layer formed on the wafer's upper surface as previously described in connection with FIG. 1a. An oxygen-impermeable mask 78 is next formed by selective removal of the duplex layer, after which the unmasked surface areas of wafer 70 are locally oxidized to form a variable thickness oxide layer 80. As shown in FIG. 2a, layer 80 is recessed in the upper surface of the wafer and includes symmetrically tapered oxide beaks 82 that extend beneath the margins of mask 78. Deep diffusion of boron from region 76 during the local oxidation forms a deep p+ region, or well, 84 in wafer 70 as shown.

Figure 2C:
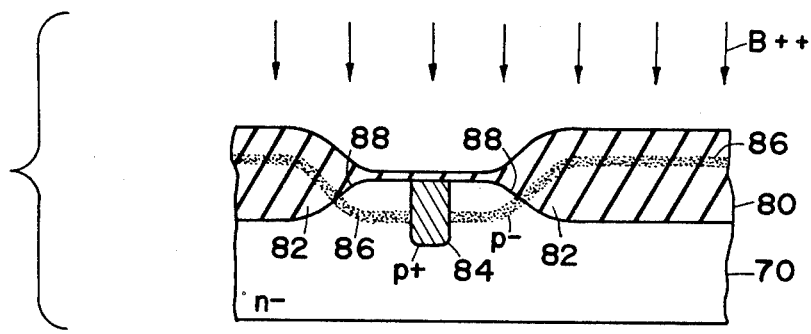

Next, mask 78 is removed and a thin layer 86 of a p-type impurity such as boron is implanted at a depth such that it crosses the slopes 88 on the wafer surface underlying (and resulting from) oxide beaks 82, as illustrated in FIG. 2c.

Figure 2D:
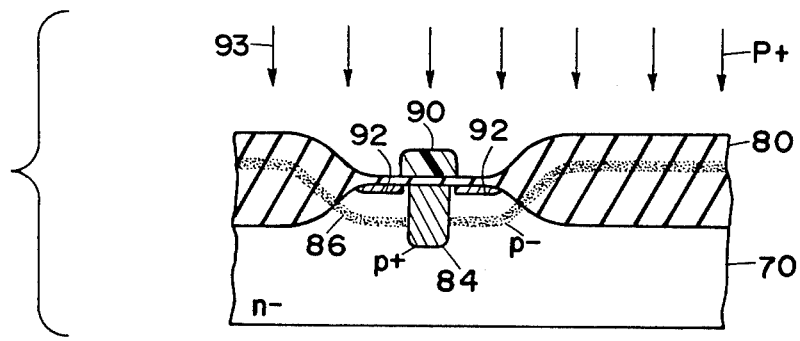

Referring to FIG. 2d, a photoresist mask 90 is next provided on oxide layer 80 overlying well 84. The principal function of mask 90 is to prevent the conductivity of the well from being reduced adjacent the substrate surface during the subsequent formation of n+ source regions 92. The source regions are suitably formed by ion bombardment with an n-type impurity such as phosphorus, as indicated by arrows 93.

Figure 2E:
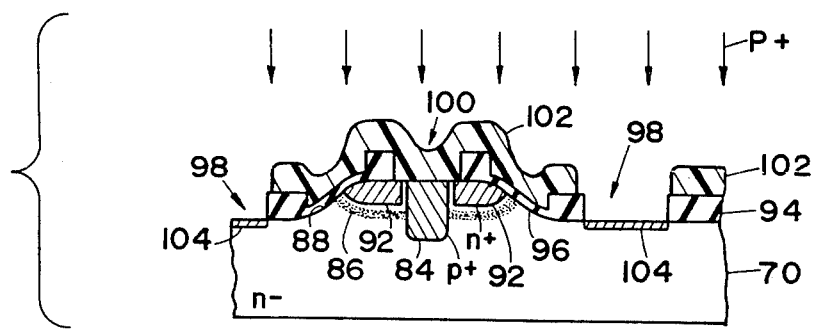

Oxide layer 80 is stripped from wafer 70 and an approximately 1 micron thick layer 94 of $SiO_2$ is deposited on the upper surface of the wafer. Portions of layer 94 overlying slopes 88 are selectively removed by photoetching where insulated gates are to be located, and a thin (about 1000 angstroms) gate oxide film 96 is grown on the thus exposed areas of wafer 70. Additional portions of oxide layer 94 are selectively removed to expose the wafer surface at locations 98 where drain regions are to be formed, and at a location 100 on the wafer's plateau region where a source electrode is to be provided subsequently. A layer 102 of photoresist having openings at locations 98 is applied to the wafer, after which an n-type impurity, suitably phosphorus, is implanted at those locations to form n+ drain regions 104 adjoining the exposed wafer surface. The resulting structure is shown in FIG. 2e.

Figure 2F:
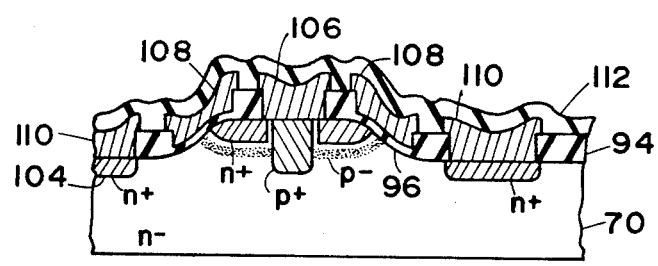

After removing photoresist layer 102 and annealing the wafer, source, gate, and drain electrodes 106, 108, 110 respectively, are provided in a conventional manner. Finally, a passivation coating 112 of $SiO_2$ or $Si_3N_4$ is applied. The resulting transistor structure, which is shown in FIG. 2f, is useful in the construction of high speed static random access memories.

Figure 3A:
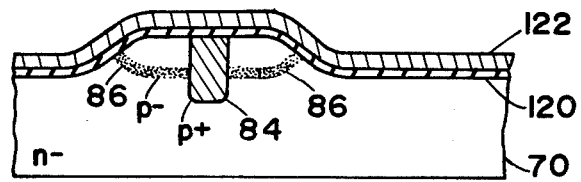
FIGS. 3a–3c illustrate alternative steps in making a silicon gate MOS device according to a third embodiment of the invention.
Figure 3B:
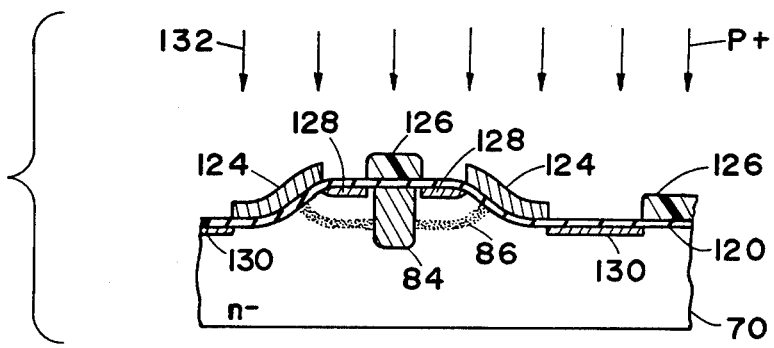
Figure 3C:
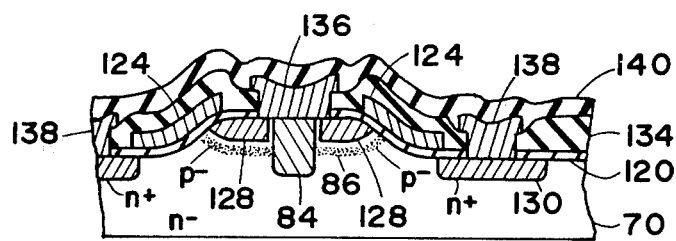

Steps in the manufacture of a silicon gate MOS transistor structure according to a third embodiment of the invention are illustrated in FIGS. 3a-3c of the drawings. Fabrication of the silicon gate device proceeds initally in the same manner as described in connection with FIGS. 2a-2c. Thus, beginning with the structure shown in FIG. 2c, and adopting the same reference numerals for like elements, oxide layer 80 is stripped from wafer 70 and a thin oxide film 120 formed on the nonplanar upper surface of the wafer. Film 120 suitably has a thickness of about 1000 angstroms. A layer 122 of polycrystalline silicon, suitably about 0.5 microns thick, is deposited in a known manner on the oxide film, resulting in the structure shown in FIG. 3a.

Gate electrodes 124 are formed on the slope portions of oxide film 120 by selective photoetching of layer 122. Next, a photoresist masking layer 126 is provided that includes openings exposing the gate electrodes and areas of the oxide film-covered wafer surface where n+ source and drain regions are to be formed subsequently. Source regions 128 and drain regions 130 are then provided in wafer 70 by ion implantation of phosphorus or other n-type impurity, as indicated by arrows 132 in FIG. 3b. The conductivity of the unmasked polycrystalline silicon gate electrodes is simultaneously increased by the phosphorus implantation.

After removing masking layer 126 and annealing wafer 70, a $SiO_2$ layer 134 is formed over the entire surface of the wafer. Portions of oxide layer 134, which suitably has a thickness of about 0.5 microns, and corresponding portions of oxide film 120 over well 84, source regions 128, and drain regions 130 are removed by photoetching. Metal soure and drain electrodes 136, 138 respectively are then provided in a conventional manner, after which a passivation coating 140 is applied. The resulting silicon gate MOS transistor structure is shown in FIG. 3c. As will be evident, it is essentially similar, except for the gate structure, to the transistor structure shown in FIG. 2f. A silicon gate version of the FIG. 1g structure can be provided in a similar manner.

An improved method for making narrow channel MOS devices has been disclosed according to the best mode presently contemplated for practicing the invention. The disclosed method is readily adaptable, with only minor changes, to existing MOS processes, and enables the manufacture of high performance MOS transistors at reduced cost compared to other high performance technologies. In addition, by utilizing the slope formed by local oxidation of a masked semiconductor surface, improved packing density is achieved.

While several embodiments of the present invention have been described, and certain modifications suggested, it will be understood that the invention is not limited to the details shown and described herein. The true, legal scope of the invention is defined by the following claims:

We claim:

1. A method for manufacturing a semiconductor device comprising the steps of
providing a relatively thin oxide layer on a major surface of a semiconductor substrate, forming an oxgen-impermeable mask overlying a first surface region of the substrate, growing a relatively thick oxide layer on the unmasked portion of the substrate surface, which layer includes an oxide beak extending between the margin of said mask and the underlying portion of said first region, removing said mask, ion implanting a first impurity into said substrate through said oxide beak and first surface region to form a thin layer of said impurity within the substrate, said layer having an upturned margin terminating at the surface of the substrate beneath said beak, introducing a second impurity of a conductivity type opposite that of said first impurity into said semiconductor substrate through first surface region thereof to form a first zone of said second impurity overlying said thin impurity layer, forming on said substrate surface a mask having a window therein overlying a second region of said surface, and introducing said second impurity into said substrate through said window and second surface region to form a second zone of said second impurity spaced from said first zone.

2. A method for manufacturing a semiconductor device comprising the steps of forming on a first region of a semiconductor substrate surface a mask comprising an oxygen-impermeable material, selectively oxidizing the substrate surface to provide a relatively thick oxide layer on the unmasked portion thereof, which layer includes a beak extending between the margin of said oxygen-impermeable material and the underlying portion of said first region, removing said oxygen impermeable material, ion implanting a first impurity into said semiconductor substrate through said oxide beak and first surface region to form a zone of said first impurity that terminates at the substrate surface beneath said beak, introducing a second impurity of a conductivity type opposite that of said first impurity into said semiconductor substrate through said first surface region to form a first zone of said second impurity adjacent said first impurity zone, forming on said substrate surface a mask having a window therein overlying a second region of said surface, and introducing said second impurity into said substrate through said window and second surface region to form a second zone of said second impurity spaced from said first impurity zone.

3. A method for manufacturing a field effect semiconductor device comprising the steps of forming on a first region of a semiconductor substrate surface a mask comprising an oxygen-impermeable material, selectively oxidizing the substrate surface to provide a first oxide layer on the unmasked portion thereof, which layer includes a beak extending between the margin of said oxygen impermeable material and the underlying portion of said first region, removing said oxygen impermeable material, ion implanting a first impurity into said semicoductor substrate through said first surface region thereof to form a zone of said first impurity that terminates at the substrate surface beneath said beak, introducing a second impurity of a conductivity type opposite that of said first impurity into said semiconductor substrate through said first surface region thereof to form a first zone of said second impurity adjacent said substrate surface and the termination of said first impurity zone therewith, removing said first oxide layer, forming an insulating oxide film over a second substrate surface region that includes the surface termination of said first impurity zone, which film forms a gate insulator for said device, forming on said substrate a mask having a window overlying a third region of said substrate surface, and introducing said opposite conductivity type impurity into said substrate through said third surface region thereof to form a second zone of said second impurity adjacent the substrate surface and separated from said first zone of said impurity by a region of the substrate surface that includes the termination of said first impurity zone therewith.

4. The method of claim 3, wherein said opposite conductivity type impurity is introduced by ion implantation.

5. The method of claim 3, wherein said first impurity is a p-type impurity and said second impurity is an n-type impurity.

6. The method of claim 3, including the subsequential step of selectively depositing conductive material overlying at least a portion of each impurity zone to form source, gate and drain electrodes for said device.

7. A method of making an insulated gate field effect semiconductor device comprising a semiconductor body having a pair of spaced zones of one conductivity type adjoining a surface of said body, which zones constitute source and drain zones in the device, a narrow zone of the opposite conductivity type disposed adjoining said surface intermediate said source and drain zones, an insulating layer disposed over a portion of the region of said surface between said source and drain zones, a gate electrode disposed on said insulating layer, and source and drain electrodes in electrical contact with said source and drain zones, respectively, which method comprises:

forming on a first region of said body surface a mask comprising an oxygen-impermeable material, selectively oxidizing said body surface to provide an oxide layer on the unmasked portion thereof, which layer includes a beak extending between the margin of said oxygen-impermeable material and the underlying portion of said first region, removing said oxygen impermeable material, ion implanting an impurity of said opposite conductivity type into said semiconductor body through said first surface region to form a narrow zone of said impurity terminating at said surface beneath said beak, and removing said oxide ayer.

* * * * *

UNITED STATES PATENT AND TRADEMARK OFFICE
CERTIFICATE OF CORRECTION

PATENT NO. : 4,261,761
DATED : April 14, 1981
INVENTOR(S) : Shuichi Sato, Tadanori Yamaguchi, Arthur D. Ritchie It is certified that error appears in the above-identified patent and that said Letters Patent are hereby corrected as shown below:

Col. 2, line 10, reads "a oxygen" should read --an oxygen--

Col. 3, line 48, reads "bout" should read --about--

Col. 4, line 14, reads "is about" should read --at about--

Col. 8, line 65, reads "ayer" should read --layer--

Signed and Sealed this

Twenty-first Day of July 1981

[SEAL]

Attest:

Attesting Officer

GERALD J. MOSSINGHOFF

Commissioner of Patents and Trademarks